United States Patent
Watanabe et al.

(10) Patent No.: US 6,895,032 B2
(45) Date of Patent: May 17, 2005

(54) HIGH-PRESSURE PROCESSING APPARATUS

(75) Inventors: Katsumi Watanabe, Takasago (JP); Takahiko Ishii, Takasago (JP); Shogo Sarumaru, Takasago (JP); Hideshi Yamane, Takasago (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 0 days.

(21) Appl. No.: 10/625,529

(22) Filed: Jul. 24, 2003

(65) Prior Publication Data

US 2004/0069111 A1 Apr. 15, 2004

(30) Foreign Application Priority Data

Aug. 2, 2002 (JP) ........................................ 2002-226597

(51) Int. Cl.[7] .................................................. F27D 7/06
(52) U.S. Cl. ...................................... 373/110; 219/658
(58) Field of Search ................................ 373/109–130, 373/137; 219/385–403, 647–651, 658–659; 100/317; 427/331, 350; 134/140, 186, 1.1, 1.3; 438/704

(56) References Cited

U.S. PATENT DOCUMENTS

| | | | | |
|---|---|---|---|---|
| 5,194,406 A | * | 3/1993 | Bok et al. | 438/704 |
| 5,518,771 A | * | 5/1996 | Jeffryes et al. | 427/331 |
| 5,898,727 A | | 4/1999 | Fujikawa et al. | 373/110 |
| 5,983,906 A | * | 11/1999 | Zhao et al. | 134/1.1 |
| 6,619,304 B2 | * | 9/2003 | Worm | 134/140 |

FOREIGN PATENT DOCUMENTS

| | | |
|---|---|---|
| JP | 7-502376 | 3/1995 |
| JP | 9-292181 | 11/1997 |
| JP | 10-335408 | 12/1998 |
| JP | 11-87306 | 3/1999 |
| JP | 2001-96103 | 4/2001 |
| JP | 2001-250821 | 9/2001 |
| JP | 2001-280856 | 10/2001 |

* cited by examiner

*Primary Examiner*—Tu Hoang
(74) *Attorney, Agent, or Firm*—Oblon, Spivak, McClelland, Maier & Neustadt, P.C.

(57) ABSTRACT

A high-pressure processing apparatus for supplying a pressure medium into a high-pressure processing chamber 4, which is formed in a pressure vessel 1 to treat a workpiece at a high pressure, is provided. The pressure vessel 1 includes a first vessel section 2 and a second vessel section 3, which can be separated from each other in the axial direction, wherein the high-pressure processing chamber 4 is formed between the first and second vessel sections 2 and 3. Furthermore, a face seal section 5 for tightly sealing the high-pressure processing chamber 4 is formed in the abutment of the first and second vessel sections 2 and 3. A press apparatus 7 for providing an axial force to the face seal section 5 is disposed and the press apparatus 7 has a space 15 for storing a supplementary apparatus, such as a stirrer or the like at a position corresponding to the axial center of the pressure vessel 1. Such a structural arrangement allows a face seal type high-pressure processing apparatus to be realized, onto which the supplementary apparatus, such as a stirrer or the like, can be mounted.

7 Claims, 5 Drawing Sheets

HIGH-PRESSURE PROCESSING APPARATUS

BACKGROUND OF THE INVENTION

1. Field of the Invention

The present invention relates to a high-pressure processing apparatus capable of being operated, for instance, in the process of manufacturing semiconductor devices and, in particular, in the process of treating wafers or glass substrates for liquid crystal.

2. Description of the Related Art

In such a conventional high-pressure processing apparatus, an radial seal is employed as for a seal section between a lid member and a pressure vessel, wherein an axial force generated under a high pressure medium is received by a press frame and columns (see, for example, Japanese Unexamined Patent Application Publications No. 2001-250821 and No. 2001-280856). Alternatively, a face seal is employed as for a seal section, wherein an axial force is received by a press apparatus, such as a hydraulic cylinder (see, for example, PCT Japanese Translation Patent Publication No. 7-502376, Japanese Unexamined Patent Application Publications No. 9-292181, No. 10-335408 and No. 2001-96103).

In the case of the radial seal type high-pressure processing apparatus, the slide movement of the seal section causes particles to be generated therefrom.

In the case of the face seal type high-pressure processing apparatus, much less particles are generated, because the seal section is not slid any longer. Accordingly, this type high-pressure processing apparatus is suitable for the process of manufacturing semiconductor devices or the like, where the generation of particles is strictly suppressed.

On the other hand, a supplementary apparatus to stir a processing fluid in a high-pressure processing chamber is employed in the process of manufacturing semiconductor devices (see, for example, Japanese Unexamined Patent Application Publication No. 11-87306).

There is a requirement that a high-pressure processing apparatus of the face seal type is further equipped with such a supplementary apparatus.

Since, however, the above-mentioned press apparatus is normally employed in such a conventional high-pressure processing apparatus of the face seal type, there exists a possible problem that the above-mentioned supplementary apparatus can not be disposed outside the pressure vessel.

SUMMARY OF THE INVENTION

Accordingly, it is an object of the present invention to provide a face seal type high-pressure processing apparatus onto which a supplementary apparatus, such as a stirrer device or the like, can be mounted.

To attain the above-mentioned object, the present invention provides the following means: A high-pressure processing apparatus comprising: a pressure vessel including a first vessel section and a second vessel section capable of axial separation from each other for treating a workpiece with a high pressure medium in a high-pressure processing chamber formed between the first and second vessel sections; a face seal section formed in the contact area between the first and second vessel sections for sealing the high-pressure processing chamber; a press apparatus for providing an axial force to the face seal section, said press apparatus being disposed so as to press against the second vessel section by contacting with a part of a surface of the second vessel section opposite to the first vessel section; and a supplementary apparatus for changing the condition in the high-pressure processing chamber, said supplementary apparatus being disposed so as to be in contact with a part of the surface of the second vessel section which surface being pressed by the press apparatus, said part of the surface becoming in no contact with the press apparatus.

In accordance with the above configuration according to the present invention, the supplementary apparatus for changing the condition of inside of the processing chamber is disposed in the space of the press apparatus, thereby enabling the space necessary for installation to be reduced.

In this case, the supplementary apparatus is disposed preferably coaxially with the second vessel section, or part of the surface of the second vessel section, which part is in contact with the press apparatus and which surface is pressed by the press apparatus, is formed in an annular shape. Such configuration allows the space to be utilized with higher efficiency.

As for the supplementary apparatus above, a stirrer for stirring the pressure medium in the high-pressure processing chamber, or a driving apparatus for moving the stage for the workpiece, which stage is disposed in the high-pressure processing chamber, or a conducting pipe system for supplying the pressure medium into the high-pressure processing chamber may be employed.

Moreover, the high-pressure processing apparatus can be designed such that a spacer unit is interposed between the press apparatus and the second vessel section, so that the press apparatus presses against the second vessel section through the spacer unit. In this case, the workpiece can be taken out from the inside of the high-pressure processing chamber by removing the spacer unit.

Further objects, features and advantages of the present invention will become apparent from the following description of the preferred embodiments with reference to the accompanying drawings.

DESCRIPTION OF THE PREFERRED EMBODIMENTS

Referring now to the accompanying drawings, the embodiments of the present invention will be described.

Figure 1:
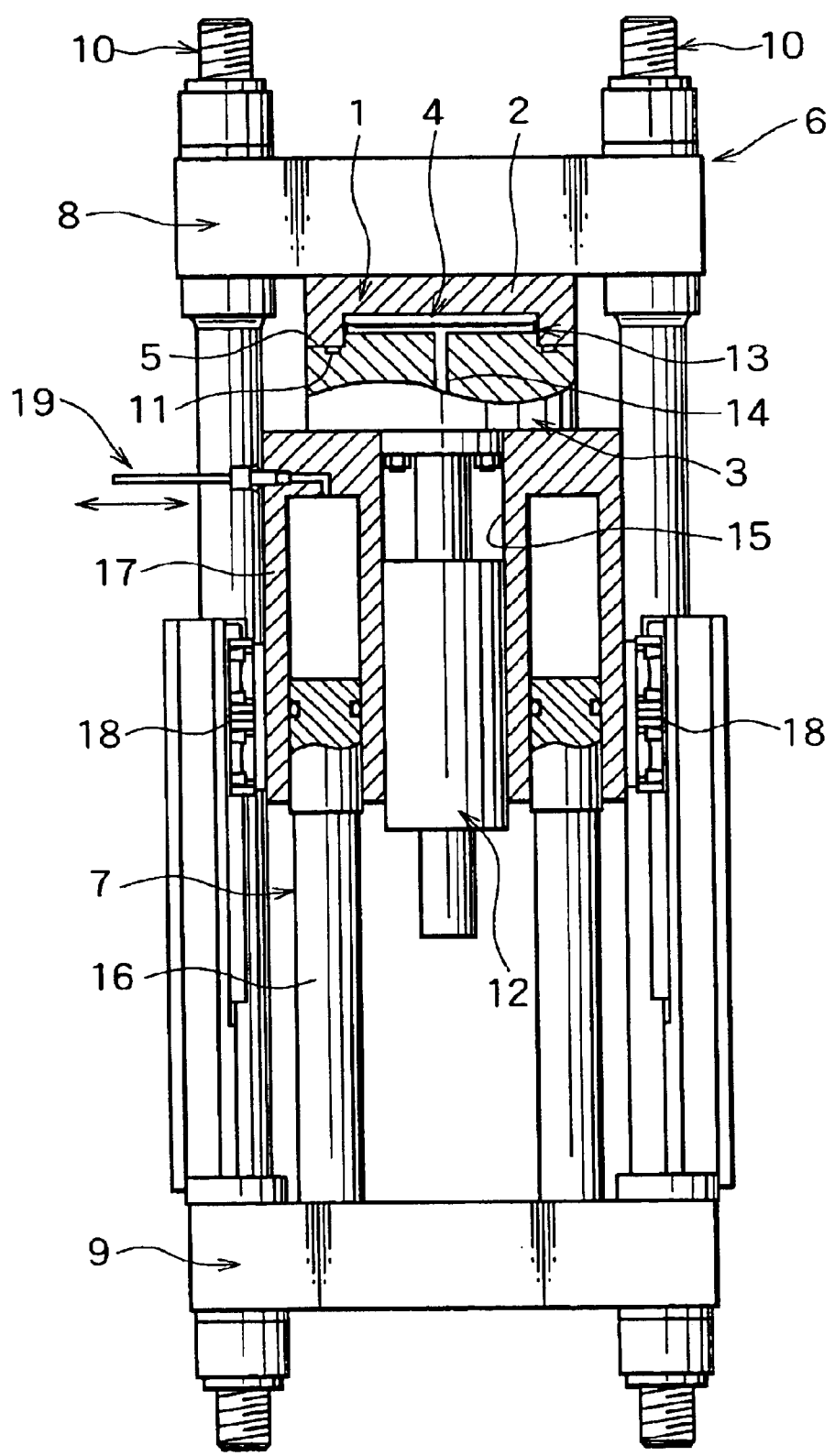
FIG. 1 is a side view of a high-pressure processing apparatus in an embodiment of the invention, when a high-pressure processing chamber is closed, together with a partial sectional view thereof.

In FIG. 1, a high-pressure processing apparatus includes a pressure vessel 1. The pressure vessel 1 comprises a first vessel section 2 and a second vessel section 3 which are capable of axial separation from each other. A high-pressure processing chamber 4 for placing a workpiece therein is formed between the first vessel section 2 and the second vessel section 3, and a face seal section 5 for sealing the high-pressure processing chamber 4 is further formed in the contact area between the first vessel section 2 and the second vessel section 3.

It is possible to supply a pressure medium into the high-pressure processing chamber 4 by connecting conducting pipes (not shown) are connected to the pressure vessel 1. In an embodiment, a liquid is used as for the pressure medium, and a semiconductor wafer or a glass substrate for liquid crystal is used as for the workpiece.

The pressure vessel 1 is supported by an axial force supporting apparatus 6 in such a manner that the first vessel section 2 and the second vessel section 3 are not separated from each other, and a press apparatus 7 for providing the axial force to the face seal section 5 to prevent the pressure medium in the high-pressure processing chamber 4 from leaking therefrom is interposed between the axial force supporting apparatus 6 and the pressure vessel 1.

The axial force supporting apparatus 6 comprises an upper plate 8, a lower plate 9 and tie rods 10 for un-movably fixing the upper plate 8 and the lower plate 9 to each other. The press apparatus 7 is disposed on the upper surface of the lower plate 9, and the pressure vessel 1 is clamped between the upper surface of the press apparatus 7 and the lower surface of the upper plate 8.

The first vessel section 2 is formed in the shape of a column having a longitudinal axial center. The upper and lower surfaces of the first vessel section 2 are flat surfaces, which are parallel to each other, and a concentric hole is formed opening toward the side of the lower surface.

The upper surface of the first vessel section 2 is fixed to the lower surface of the upper plate 8 in the axial force support apparatus 6.

The second vessel section 3 is also formed in the shape of a column having a longitudinal axial center. The upper and lower surfaces of the second vessel section 3 are flat surfaces, which are parallel to each other, and a concentric circular step section projecting upward is formed on the upper surface.

By coupling the step section to the hole, the high-pressure processing chamber 4 is formed between the upper surface of the step section and the bottom surface of the hole.

By interposing a seal element 11 in the contact area between the lower surface of the first vessel section 2 and the upper surface of the second vessel section 3, the face seal section 5 is formed therein.

The pressure vessel 1 is equipped outside with a supplementary apparatus 12 for changing the condition in the high-pressure processing chamber 4. In the first embodiment, the supplementary apparatus 12 is mounted onto the axial center on the lower surface of the second vessel section 3.

In other words, a stage 13 is disposed in the high-pressure processing chamber 4, and the workpiece is placed on the stage 13. The stage 13 is supported by a shaft 14, which passes through the axial center of the second vessel section 3. The lower end of the shaft 14 is connected to the supplementary apparatus 12.

That is, the supplementary apparatus 12 is constituted by a driving apparatus for providing the rotary movement, or the up and down movement, or the oscillation for the stage 13. The driving apparatus may be constructed preferably by an electro-magnetic motor or the like.

The lower surface of the pressure vessel 1, i.e., the lower surface of the second vessel section 3, is supported by the press apparatus 7.

The press apparatus 7 is constituted by a cylinder having predetermined dimensions, which cylinder is extendable in the axial direction. In the press apparatus 7, a space 15 which passes through in the axial center direction is formed in a position corresponding to the axial center of the pressure vessel 1.

The supplementary apparatus 12 is stored in the space 15.

That is, the press apparatus 7 is constituted by an annular piston 16 disposed on the upper surface of the lower plate 9 and an annular cylinder 17 which is slidably coupled to the piston 16 in the vertical direction. An empty space at the center of the annular cylinder 17 forms the space 15, and the supplementary apparatus 12 is disposed therein.

The upper surface of the cylinder 17 supports the lower surface of the second vessel section 3. The vertical movement of the cylinder 17 is guided by guides 18, which are standing on the lower plate 9.

The type of cylinder for the press apparatus 7 is single-acting, and a conducting pipe 19 for supplying the pressure medium into the cylinder space is connected to the cylinder 17.

By introducing a high-pressure medium via the conducting pipe 19, the second vessel section 3 is pressed against the first vessel section 2 to provide a press force against the face seal section 5, so that a pressure generated in the high-pressure processing chamber 4 can be maintained by the upper and lower plates 8 and 9, which are connected to each other via the tie rods 10.

The cross section of the annular space in the inside of the cylinder of the press apparatus 7 in the horizontal direction is designed such that it is larger than the cross section of the inner space of the high-pressure processing chamber 4 in the horizontal direction. That is, the press apparatus 7 is supportable by a working pressure, which is lower than the pressure in the high-pressure processing chamber 4.

Figure 2:
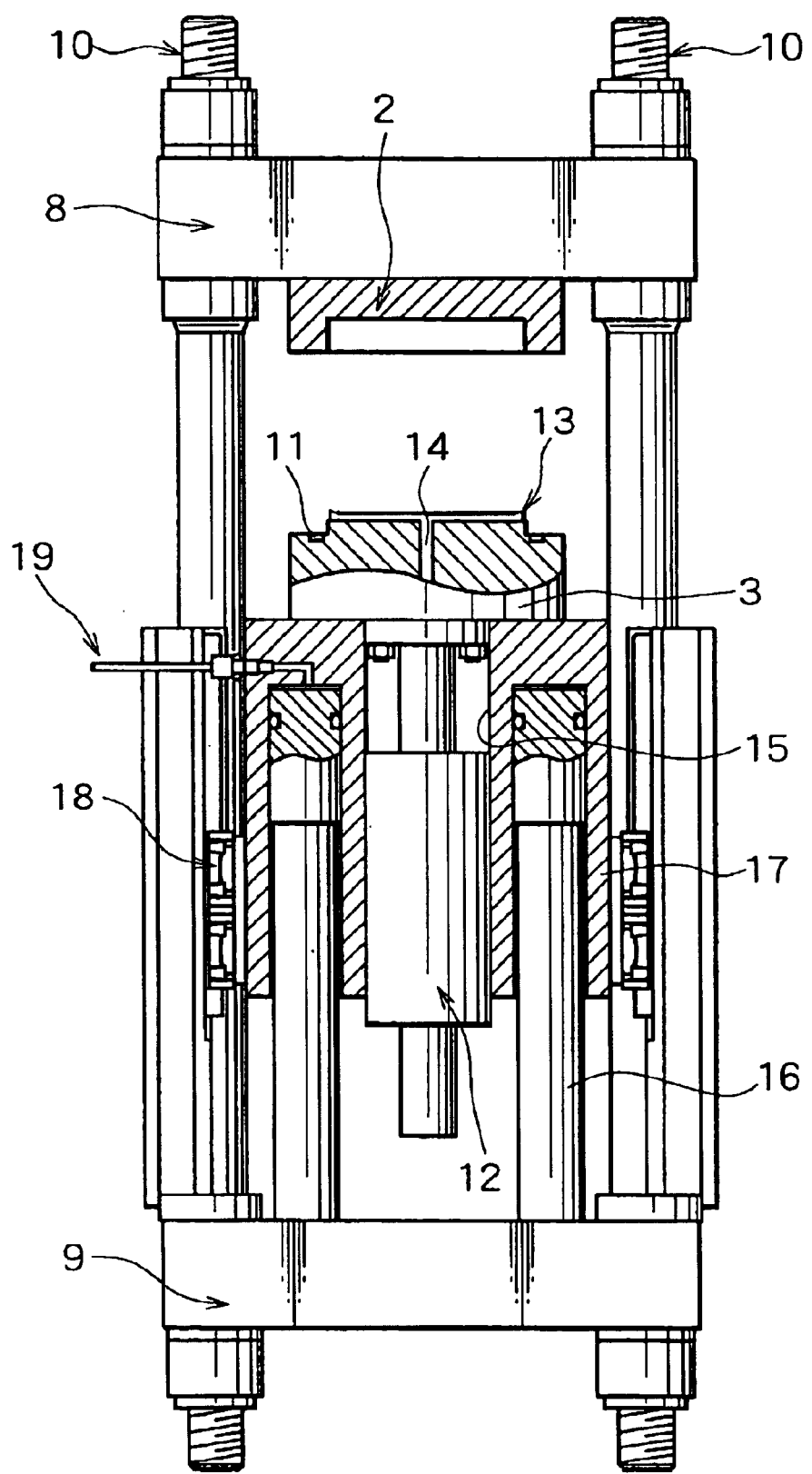
FIG. 2 is a side view of a high-pressure processing apparatus in FIG. 1, when the high-pressure processing chamber is opened, together with a partial sectional view thereof.

As shown in FIG. 2, the ejection of the pressure medium from the cylinder chamber causes the vertical position of the second vessel section 3 to be lowered, so that the high-pressure processing chamber 4 can be opened, thereby making it possible to carry out the removing/mounting of the workpiece.

In the first embodiment, the supplementary apparatus 12 can be formed such that either it is fixed to the annular cylinder 17 or it is unified thereto in the form of a single element. Moreover, the position of the cylinder 17 and piston 16 can be changed upside down. The first and second vessel sections 2 and 3 can also be arranged upside down. In this case, the stage 13 and the supplementary apparatus 12 are arranged in the vessel section disposed on the lower side. Of course, the entire system can also be disposed upside down.

Figure 3:
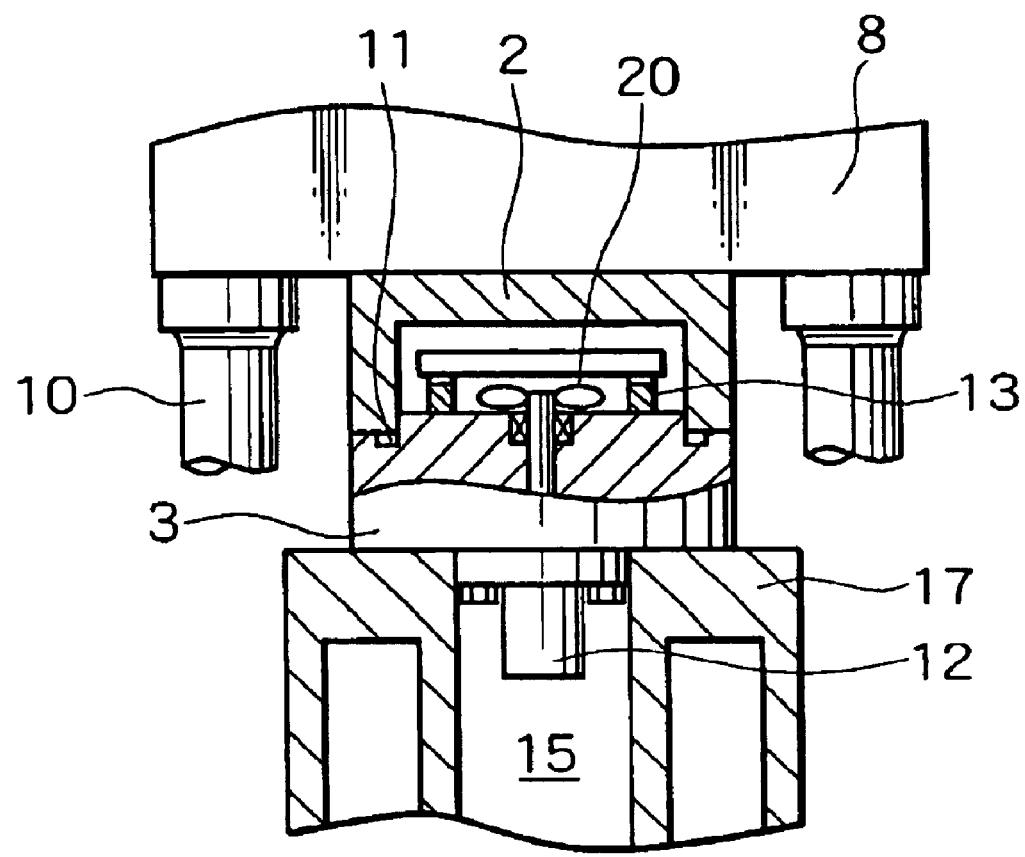
FIG. 3 is a partial sectional view of another embodiment of a supplementary apparatus.

FIG. 3 shows another embodiment of the present invention, in which case, a stirrer for stirring a pressure medium in the high-pressure processing chamber 4 is employed as for the supplementary apparatus 12.

The stirrer comprises stirring blades 20 rotatably mounted onto the axial center of the second vessel section 3 and a driving section 21 for rotating the stirring blades 20. The driving section 21 is mounted on the lower surface of the second vessel section 3 and the driving section 21 is disposed in the space 15 of the press apparatus 7.

Furthermore, a pipe system including pipes and valves for supplying the pressure medium into the high-pressure processing chamber 4 can be employed as the supplementary apparatus 12, although these are not shown.

Figure 4:
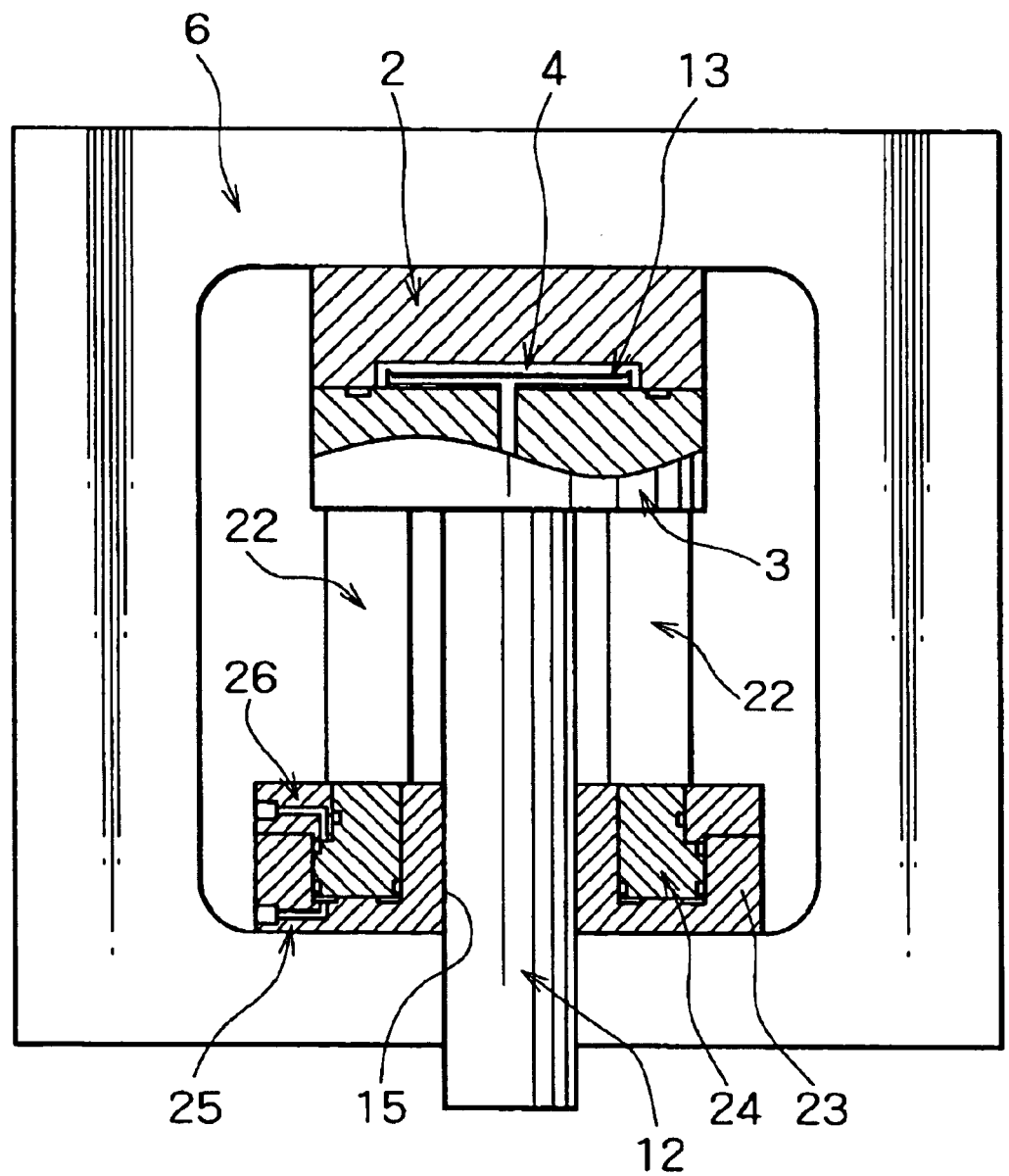
FIG. 4 is a side view of a high-pressure processing apparatus in another embodiment of the invention, when a high-pressure processing chamber is closed, together with a partial sectional view thereof.
Figure 5:
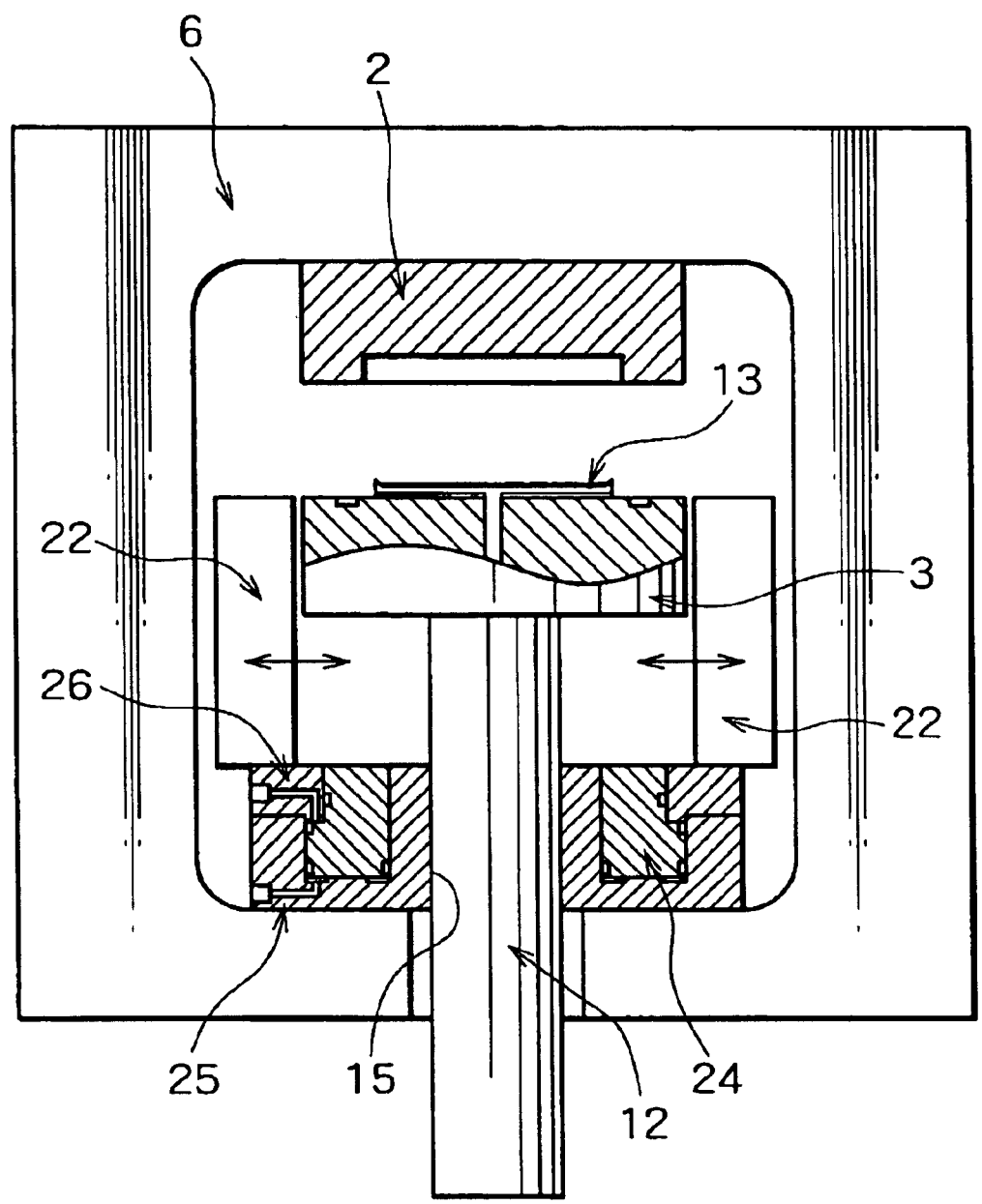
FIG. 5 is a side view of a high-pressure processing apparatus in FIG. 4, when the high-pressure processing chamber is opened, together with a partial sectional view thereof.

FIGS. 4 and 5 show another embodiment of the present invention. In this case, a spacer unit 22 is interposed between the press apparatus 7 and the pressure vessel 1, so that the workpiece can be taken out from the inside of the high-pressure processing chamber 4 by removing the spacer unit 22 therebetween.

That is, the spacer unit 22 comprising a pair of left and right spacers is movable in the state shown in FIG. 4 or in the state shown in FIG. 5.

In this embodiment, the axial force supporting apparatus 6 is formed by a closed frame having an empty space in the center. The press apparatus 7 is placed on the upper surface of the lower part of the closed frame, to which the upper surface of the first vessel section 2 is fixed.

The spacer unit which is a pair of left and right spacers is mounted on the upper surface of the press apparatus 7 such that they can be moved in the horizontal direction by a displacement apparatus (not shown). Moreover, the second vessel section 3 is supported on the upper surface of the spacer unit 22, and the second vessel section 3 can be moved up and down with an elevation unit (not shown).

The press apparatus 7 is constituted by a double-acting cylinder. That is, the annular cylinder 23 is placed on the lower part of the frame, and an annular piston 24 is engaged with the cylinder 23 such that it is slidably moved in the vertical direction. The spacer unit 22 can be disposed on the upper surface of the piston 24. The cylinder 23 is equipped with a hole 25 for supplying the pressure medium to move the piston 24 upward in the vertical direction and another hole 26 for supplying the pressure medium to move the piston 24 downward in the vertical direction.

In this embodiment, a supplementary apparatus 12 for changing the condition in the high-pressure processing chamber 4 is also disposed at the center on the lower surface of the pressure vessel 1. The supplementary apparatus 12 is disposed in the space 15 of the press apparatus 7.

In accordance with the embodiment above, the high-pressure processing apparatus is of the face seal type, so that the generation of particles can be suppressed less than the high-pressure processing apparatus of the radial seal type. Furthermore, the supplementary apparatus 12 for changing the condition in the processing chamber can be disposed in the space of the press apparatus, thereby enabling the space required for the treatment apparatus to be reduced.

The present invention is not restricted to the above-mentioned embodiment. For instance, a so-called cotter type press apparatus can be employed, instead of the cylinder type press apparatus.

While preferred embodiments have been shown and described, various modifications and substitutions may be without departing from the spirit and scope of the invention. Accordingly, it is to be understood that the present invention has been described by way of example, and not by limitation.

What is claimed is:

1. A high-pressure processing apparatus comprising:
   a pressure vessel including a first vessel section and a second vessel section capable of axial separation from each other for treating a workpiece with a high pressure medium in a high-pressure processing chamber formed between said first and second vessel sections;
   a face seal section formed in a contact area between said first and second vessel sections for sealing said high-pressure processing chamber;
   a press apparatus for providing an axial force to the face seal section, said press apparatus being disposed so as to press against said second vessel section by contacting with a part of a surface of said second vessel section opposite to said first vessel section; and
   a supplementary apparatus for changing the condition in said high-pressure processing chamber, said supplementary apparatus being disposed so as to be in contact with another part of the surface of said second vessel section, which surface is pressed by said press apparatus, and said another part of the surface not being in contact with said press apparatus.

2. The high-pressure processing apparatus according to claim 1, wherein said supplementary apparatus is disposed in the center of said second vessel section.

3. The high-pressure processing apparatus according to claim 1, wherein said supplementary apparatus is a stirrer for stirring the pressure medium in said second vessel section.

4. The high-pressure processing apparatus according to claim 1, wherein said supplementary apparatus is a driving apparatus for moving a stage for the workpiece, said stage being disposed in said high-pressure processing chamber.

5. The high-pressure processing apparatus according to claim 1, wherein said supplementary apparatus is a conducting pipe system for supplying the pressure medium into said high-pressure processing chamber.

6. The high-pressure processing apparatus according to claim 1, wherein part of the surface of said second vessel section is in the form of an annular shape, said surface being pressed by said press apparatus and said surface being in contact with said press apparatus.

7. The high-pressure processing apparatus according to claim 1, wherein said press apparatus includes a spacer unit contacting the part of the surface, so that the workpiece can be removed from said high-pressure processing chamber by removing said spacer unit.

* * * * *